United States Patent [19]

Howell

[11] 4,429,340

[45] Jan. 31, 1984

[54] BARGRAPH DISPLAYS FOR STATIC TRIP CIRCUIT BREAKERS

[75] Inventor: Edward K. Howell, Simsbury, Conn.

[73] Assignee: General Electric Co., New York, N.Y.

[21] Appl. No.: 458,686

[22] Filed: Jan. 17, 1983

Related U.S. Application Data

[63] Continuation of Ser. No. 247,433, Mar. 25, 1981, abandoned.

[51] Int. Cl.³ .............................................. H02H 3/093
[52] U.S. Cl. ........................................ 361/96; 361/94; 340/722; 340/753; 340/664
[58] Field of Search ................................ 361/93–97, 361/62, 63, 31, 79; 324/52, 51, 424; 364/480–483, 492; 340/762, 722, 753, 378.3, 524, 717, 286 M, 664

[56] References Cited

U.S. PATENT DOCUMENTS

| | | |
|---|---|---|
| 4,038,695 | 7/1977 | DePuy ................................. 361/96 |
| 4,097,857 | 6/1978 | Miyakawa ....................... 340/762 X |
| 4,219,858 | 8/1980 | DePuy et al. .................... 364/483 X |
| 4,243,985 | 1/1981 | Quayle ................................. 340/753 |
| 4,245,318 | 1/1981 | Eckart et al. ....................... 364/481 |
| 4,351,012 | 9/1982 | Elms et al. ....................... 361/97 X |
| 4,351,013 | 9/1982 | Matsko et al. ....................... 361/96 |

OTHER PUBLICATIONS

"Motor Protection Relay IC305MLTA", General Electric Disclosure Bull., Dec 1978.

*Primary Examiner*—Patrick R. Saloe
*Attorney, Agent, or Firm*—Richard A. Menelly; Walter C. Bernkopf; Fred Jacob

[57] ABSTRACT

Separate bargraph displays controlled by the electronic trip unit of a static trip circuit breaker continuously indicate the magnitude of the highest phase current as a percentage of the log-time delay pickup current setting and the timing out of a long-time delay as a percentage of the applicable long-time trip delay interval for a given phase current in excess of the long-time delay pickup setting.

3 Claims, 2 Drawing Figures

BARGRAPH DISPLAYS FOR STATIC TRIP CIRCUIT BREAKERS

BACKGROUND OF THE INVENTION

This is a continuation of application Ser. No. 247,433, filed Mar. 25, 1981, now abandoned.

The present invention relates to static trip industrial circuit breakers and particularly to accessory indicator displays therefor.

In certain applications it is important to know rather precisely the magnitudes of the currents flowing in a particular load circuit. Thus, ammeters having digital or analog readouts are utilized to provide the requisite current readings to operating personnel; the meters typically being installed in instrument compartments of large switchboard and switchgear apparatus.

In other applications where current readings are not necessary, it would nevertheless be quite beneficial, particularly from a testing and maintenance standpoint, to know load current magnitudes. Under these circumstances, the installation of ammeters is not cost justifiable. Of course, portable ammeters may be utilized; however, they are somewhat inconvenient and hazardous to implement, particularly within the congested confines of a switchboard enclosure.

It is accordingly an object of the present invention to provide a display for generally, visually indicating the magnitude of the largest phase current flowing in a load circuit protected by a static trip circuit breaker.

A further object is to provide a current magnitude indicating display of the above character which utilizes the current magnitude indicative signals derived by the phase current sensing transformers of a static trip circuit breaker.

An additional object of the present invention is to provide as an accessory for a static trip circuit breaker a display for generally, visually indicating the time out or elapsed time of a trip delay interval running from the time an overcurrent condition is detected to the initiation of a circuit breaker trip function.

Yet another object is to provide a trip delay interval elapsed time indicating display of the above character in conjunction with a display for generally, visually indicating the magnitude of the largest phase current flowing in a load circuit protected by a static trip circuit breaker.

An additional object is to provide an elapsed time indicating display and a phase current magnitude indicating display of the above character which are readily and economically adapted, either jointly or separately, as accessories to a static trip circuit breaker.

Other objects of the invention will in part be obvious and in part appear hereinafter.

SUMMARY OF THE INVENTION

In accordance with the present invention, there is provided, as an accessory for static trip circuit breakers, an inexpensive display for generally indicating the magnitude of current flowing in a load circuit in which a static trip circuit breaker is installed. A signal proportional to the highest magnitude phase current sensed by current transformers linked with the various phase conductors of the load circuit is utilized, in addition to providing the informational input to the trip unit programmer signal processing circuitry, to drive a current magnitude indicating display. In the preferred embodiment of the invention herein disclosed, this display takes the form of an LED bargraph display. Since static trip units are typically adjustable over a range of overcurrent threshold or pickup settings to conveniently tailor the trip unit response to the particular load circuit involved, the bargraph display is preferably adapted to generally indicate the largest phase current magnitude as a percentage of the adjustably selected overcurrent pickup setting. Thus, when the display indicates 100 percent, the pickup current setting is exceeded, which in the illustrated embodiment is the long-time delay pickup setting. The trip unit then, pursuant to normal operating procedure, begins timing out a long-time delay interval whose duration is inversely proportional to the square of the largest phase current magnitude so long as it exceeds the long-time pickup current setting. Upon expiration of this delay interval, a trip function is initiated to trip the circuit breaker.

In accordance with another aspect of the present invention, there is provided an accessory display, preferably an LED bargraph display, for progressively indicating the long-time delay interval being timed out. Specifically, this display generally indicates the elapsed time of the long-time delay interval as a percentage of its overall duration which is typically also adjustably pre-selected to one of a plurality of current versus time bands. To conveniently achieve this elapsed time indication, the display is driven from the long-time delay integrator included in the static trip unit. Upon expiration of the long-time delay interval, which, depending upon the largest phase current magnitude and the selected long-time delay band, may be of a duration ranging from several seconds to in excess of ten minutes, the static trip unit will initiate circuit breaker trip function.

The invention accordingly comprises the features of construction and arrangement of parts which will be exemplified in the construction hereinafter set forth, and the scope of the invention will be indicated in the claims.

For a better understanding of the nature and objects of the invention, reference should be had to the following detailed description taken in conjunction with the accompanying drawings in which:

DETAILED DESCRIPTION

Figure 1:
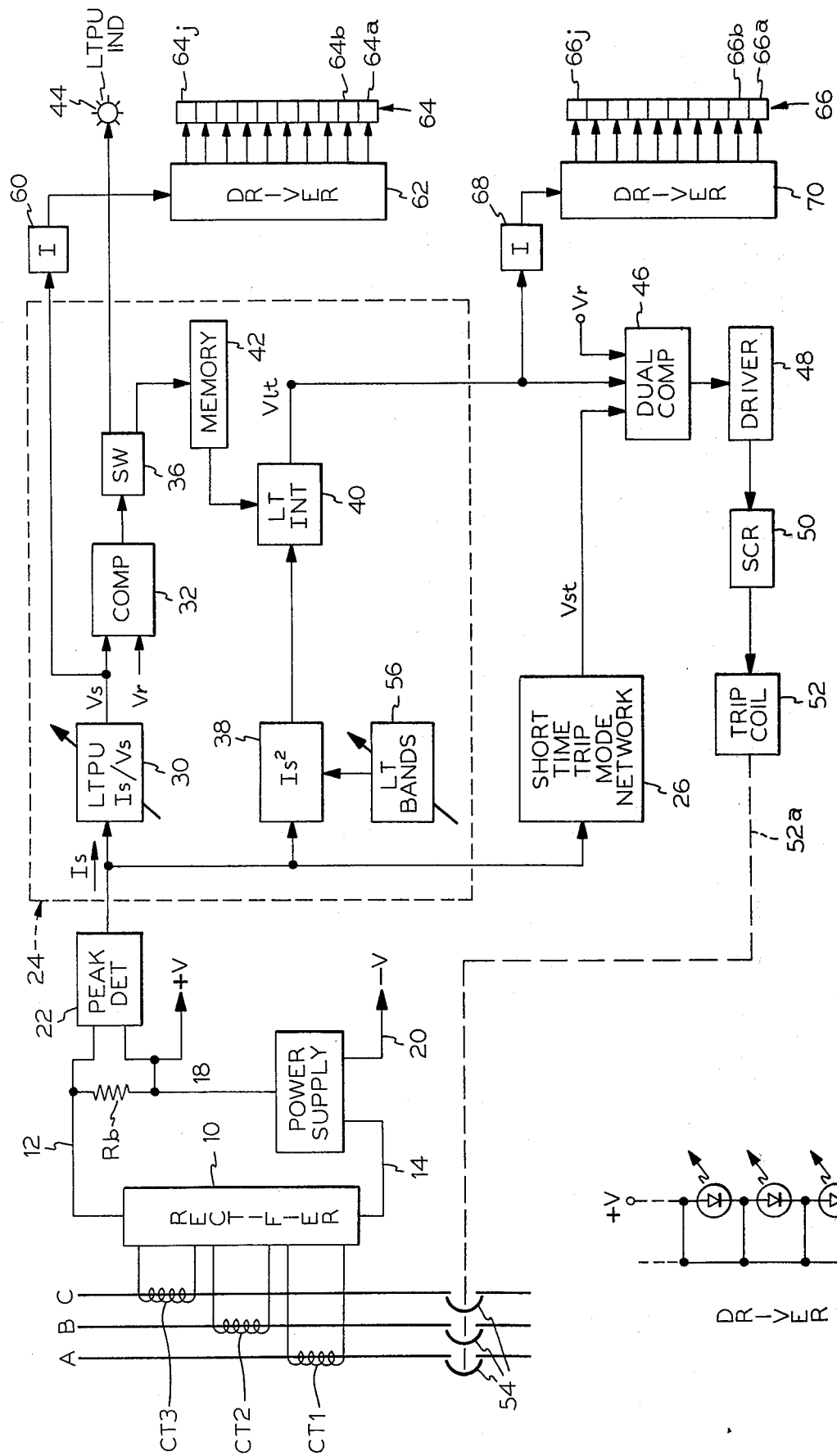
FIG. 1 is a schematic block diagram of an embodiment of the present invention.

The block diagram of FIG. 1 illustrates a circuit breaker static trip unit whose relevant portions, insofar as the present invention is concerned, are disclosed in detail in applicant's commonly assigned, co-pending application Ser. No. 072,375, filed Sept. 4, 1979, the disclosure of which being specifically incorporated herein by reference. To provide overcurrent protection for a typical three-wire power distribution circuit consisting of three line or phase conductors A, B and C, the phase currents are individually sensed by current transformers CT1, CT2 and CT3, seen in FIG. 1 herein. The multi-turn secondary windings of these current transformers are connected to a full-wave diode rectifying network, generally indicated at 10. Positive going full-wave rectified current flows out of rectifying network 10 on bus 12 and returns via negative bus 14. The current on bus 12 flows through a burden resistor Rb pursuant to developing a voltage thereacross of a magnitude proportional to the magnitude of the highest of the phase currents flowing in conductors A, B and C.

A power supply 16, connected between the lower end of burden resistor Rb and bus 14, functions to develop on a bus 18, connected at its junction with the burden resistor, a regulated supply voltage V which is positive relative to the voltage appearing on a supply bus 20. Buses 12 and 18 are also connected as separate inputs to a peak detector 22 responding to the signal voltage developed across the burden resistor. The peak detector converts the peak signal voltage appearing across the burden resistor to a proportionate current signal Is which is jointly supplied to a long-time trip mode network, generally indicated at 24, and a short-time trip mode network, generally indicated at 26. While not shown in FIG. 1, a typical circuit breaker static trip unit would further include an instantaneous trip mode network operating without intentional delay to initiate a circuit breaker trip function in response to currents of short circuit proportions flowing in any one of the distribution circuit conductors A, B, C.

The long-time and short-time trip mode networks, detailed in the above-noted co-pending application, are equipped with adjustable settings pursuant to establishing a family of trip time curves illustrated therein. Long-time trip mode network 24, seen generally in FIG. 1 herein, includes an adjustable long-time pickup circuit 30 operating to convert the current signal Is received from peak detector 22 into a proportionate voltage signal Vs which is applied as one input to a comparator 32. The other input to this comparator is a reference voltage Vr. Adjustment of the long-time pickup circuit establishes a selected threshold or pickup current level which, if exceeded by the current flowing in any one of the three distribution circuit conductors, renders the long-time trip mode network 24 operative. That is, when any one of these phase currents exceeds the selected long-time pickup level, the voltage signal VS at the output of long-time pickup circuit 30 causes comparator 32 to develop an output for actuating switch 36.

At the same time, the current signal Is at the output of detector 22 is supplied to a squaring circuit 38 which develops an output current proportional to the square of the current signal for integration by a long-time integrating circuit 40. Activation of switch 36 is operative via a memory circuit 42 to condition the long-time integrating circuit 40 to begin integrating the squared current signal issued by squaring circuit 38 so long as the current in any one of the distribution circuit phase conductors exceeds the long-time pickup level established by long-time pickup circuit 30. In addition, switch 36 activates a long-time pickup indicator 44 effective in indicating that a long-time delay trip function is being timed out. The output of the long-time integrator is in the form of a time varying voltage V1t which is supplied as one input to a dual comparator 46. A second input to this comparator is the reference voltage Vr. When this voltage achieves a predetermined relationship with respect to the reference voltage, the dual comparator activates a driver circuit 48 to trigger a thyristor 50, such as a silicon controlled rectifier. This thyristor goes into conduction to draw activating current through a trip coil 52 which is mechanically coupled, as indicated diagrammatically at 52a, to circuit breaker contacts 54 such as to trip these contacts open, thereby interrupting current flow in all three phase conductors of the distribution circuit.

Also included in the long-time trip mode network 24 is a long-time bands select circuit 56 operative to adjustably control the squaring circuit 38 such as to vary the proportionality of its squared current output signal to the current signal Is supplied to its input. Thus, as described in the above-noted co-pending application, long-time bands select circuit 56 is adjusted to select one of several long-time delay $I^2t$ bands againt which the overcurrent signal Is is to be measured.

Memory 42 is included in long-time trip mode network 24 to controllably discharge the long-time integrator 40 should the current signal Is drop below the long-time pickup while the long-time trip mode network is timing out any long-time delay. That is, memory 42 functions to reverse the rate of change of the voltage V1t at the output of integrator 40 such that the integrator is gradually reset to zero at a pre-established rate. If the over-current signal Is then rises above the long-time pickup level, switch 36 is again activated via comparator 32 and integrator 40 is again conditioned to integrate the squared current signal output from squaring circuit 38, thereby again reversing the rate of change of its output voltage V1t. Thus, the long-time integrator 40 is not abruptly reset to zero each time the overcurrent signal Is drops below the established long-time pickup level. Consequently, the long-time trip mode network 24 automatically takes into account any intermittency in an overcurrent condition on the distribution circuit while involved in timing a long-time trip function.

As detailed in the above-noted co-pending application, short-time trip mode network 26, generally illustrated herein, includes an adjustable short-time pickup circuit operating to convert the current signal Is from peak detector 22 to a proportionate voltage signal. This voltage signal is applied to a comparator together with the reference voltage Vr. When it is sensed that the overcurrent signal Is exceeds the selected short-time pickup current level, the comparator, among other things, enables a short-time integrator to begin integrating the output of a current signal Is squaring circuit included in short-time trip mode network 26. This short-time integrator develops a time varying voltage signal Vst for application as a third separate input to dual comparator 46 of FIG. 1 herein. When this time varying voltage Vst achieves a predetermined relationship with respect to the reference voltage Vr, dual comparator 46 signals driver 48 to initiate a circuit breaker trip function in the manner previously generally described in connection with the long-time trip mode network 24.

In accordance with the present invention, the signal voltage Vs proportional to the current signal Is, appearing at the output of long-time pickup circuit 30, is also applied through an inverter 60 to a light emitting diode (LED) bargraph driver circuit 62. Suitable LED driver circuits are readily available in integrated circuit form, such as, for example, the LM3914 manufactured by National Semiconductor. Driver 62 controls the activation of a bargraph display, generally indicated at 64, which, in the disclosed embodiment, consists of a linear array of ten discreet LED display segments 64a, 64b, etc. The inverter 60 is utilized because, as seen in the above-noted application Ser. No. 072,375, at zero current signal Is, voltage signal Vs sets at the positive supply voltage V. As the current signal increases, the voltage signal falls proportionately, ultimately dropping into equality with the reference voltage Vr as the current signal rises to a value indicative of the largest phase current having reached the pickup current level adjustably set into the long-time pickup circuit 30. Thus, the inverter simply converts the normal inverse relationship of signal voltage to signal current to a direct relationship for the sake of convenience in implementing driver 62.

Since the purpose of the invention is to provide an inexpensive accessory for generally, visually indicating the approximate level of phase current flowing in a load circuit and thus advise personnel of impending circuit problems, as well as to verify trip unit operability, bargraph display 64 simply indicates the relationship of the largest phase current to the pickup level adjustably set into long-time pickup circuit 30. This pickup setting normally corresponds to the current rating of the load circuit conductors and/or particular loads connected thereto, and, in effect, establishes the demarcation line between acceptable phase current levels and unacceptable or overcurrent levels of phase current. This approach, rather than indicating current magnitude in absolute values, conveniently accommodates the fact that the long-time pickup circuit is adjustable to a multiplicity of pickup settings. Thus, driver 62, in response to the inverted voltage signal Vs, selectively activates the LED display segments to indicate this relationship of phase current to pickup setting. Since the disclosed embodiment utilizes ten display segments, this relationship is visually indicated in ten percentile increments. Thus, if the largest phase current magnitude is fifteen percent of the pickup setting, display segments 64a and 64b are illuminated. If the largest phase current is ninety-five percent of the pickup setting, all of the display segments 64a-64j are illuminated. When the pickup setting is reached, comparator 32 conditions switch 36 to activate the long-time pickup indicating light emitting diode 44, as disclosed in the above-noted co-pending application.

As an additional feature of the present invention, a second bargraph display, generally indicated at 66, is implemented to visually indicate the timing out of a long-time delay interval should the magnitude of the largest phase current continue in excess of the long-time pickup setting. To this end, when switch 36 turns on, via memory 42, long-time integrator 40 to begin integrating the squared current signal Is² coming from squaring circuit 30, the integrator output voltage V1t is also applied through an inverter 68 to an LED bargraph driver 70, which may be identical to driver 62. Inverter 68 is utilized for the same reason as inverter 60, since the integrator output voltage V1t starts out at the positive supply voltage and drops linearly with time, ultimately arriving at the reference voltage level Vr applied to dual comparator 46 which then signals the expiration of the long-time delay interval by initiating a trip function, all as described in co-pending application Ser. No. 072,375.

Display 66 also consists of ten discreet LED display segments 66a, 66b, etc., which are selectively activated by driver 70 in response to the inverted voltage signal V1t. It is seen that display 66 does not indicate elapsed time in seconds, but rather as the relationship of elapsed time to the duration of the long-time delay interval jointly determined by the overcurrent magnitude of the largest phase current and the setting of long-time band select circuit 56. Since driver accommodates ten LED display segments, the long-time delay interval elapsed time is visually indicated in ten percentile increments, zero to ten percent, ten to twenty percent, etc. Thus, upon commencement of the long-time delay interval, LED display segment 66a is activated. With the expiration of ten percent of the delay interval, both display segments 66a and 66b are activated. When ninety percent of the delay interval has elapsed, all of the display segments 66a-66j are activated by driver 70.

It will be appreciated that the delay interval, determined by the rate at which the voltage V1t is falling toward the reference voltage Vr, continuously adjusts to variations in the phase overcurrent magnitude, and this will be reflected in the rate of progressive activation of the LED display segments 66a-66j. If the largest phase current magnitude should drop below the long-time pickup setting, memory 42 causes long-time integrator 40 to be discharged at a controlled rate. Voltage signal V1t then begins climbing toward the positive supply voltage V, and driver progressively deactivates the display segments in tracking fashion. Incidentally, since display segment 66a is activated as the largest phase current achieves the long-time pickup setting, long-time pickup indicator 44 is, from this standpoint, redundant. However, in those situations where an overcurrent condition ceases to exist, indicator 44 will immediately indicate this fact, whereas display 66 will not immediately do so unless memory 42 is conditioned to abruptly discharge integrator 40.

Figure 2:
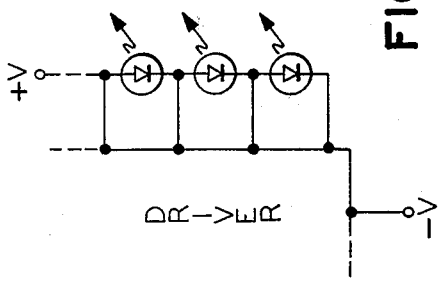
FIG. 2 is a fragmentary schematic circuit diagram of a portion of one of the light emitting diode displays utilized in the embodiment of FIG. 1.

FIG. 2 shows the light emitting diodes for the display segments of displays 64 and 66 being electrically connected in a serial array, rather than in parallel so as to avoid excessive current drain on power supply 16. To avoid the situation where the cumulative voltage drops of all ten serially connected diodes would exceed the supply voltage, the diodes are split up into two parallel connected serial strings. While not shown, capacitors may be utilized to filter the driver input voltage signals and thus mitigate flickering of the display segments at their associated transition switching voltage levels. As will be appreciated, trimming resistors are included with the display drivers to accommodate the coordination of the internally developed display segment transition switching voltages with the operating range of their voltage inputs Vs, V1t, which, in the illustrated embodiment, is the voltage difference between the positive supply voltage V and the reference voltage Vr in each instance.

While the invention has been disclosed utilizing LED displays, it will be understood that other forms of displays, such as liquid crystal displays, could be utilized. To increase resolution, additional display segments may be utilized; however, ten segments in each display is found to be sufficiently informative and most practicable from a cost standpoint. Also, additional displays may be implemented to indicate the relationships of phase current to the short-time pickup setting and the instantaneous pickup setting. While bargraph displays are preferred for their ease of immediate interpretation and because observers readily understand such displays do not intend precision readouts, other display types and configurations will occur to those knowledgeable in the art.

It will be seen that the objects set forth above, among those made apparent in the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described my invention, what I claim as new and desire to secure by Letters Patent is:

1. A static trip circuit breaker accessory including, in combination:
   a display continuously displaying phase current magnitude relative to a pre-selected adjustable pickup current level whereby a static trip unit initiates a circuit breaker trip function upon the expiration of an appropriate delay interval in response to phase current magnitudes exceeding the pre-selected pickup current level,
   a continuous display driver electrically activating said display under the control of said trip unit;
   an indicator activated by said trip unit for indicating that the phase current magnitude exceeds the pre-selected pickup level;
   an additional display continuously displaying the elapsed time of the delay interval relative to the delay interval duration; and
   an additional driver electrically activating said additional display under the control of said trip unit.

2. The accessory defined in claim 1, wherein said display comprises light emitting diode activated display segments.

3. The accessory defined in claim 1, wherein said additional display consists of an array of discreet display segments selectively activated by said additional driver to indicate the delay interval elapsed time as an approximate percentage of the delay interval duration.

* * * * *